(12) United States Patent
Rossi et al.

(10) Patent No.: US 8,483,247 B2
(45) Date of Patent: Jul. 9, 2013

(54) THERMALLY CONTROLLED EXTERNAL CAVITY TUNEABLE LASER

(75) Inventors: Giacomo Antonio Rossi, Milan (IT); Alberto Rampulla, Milan (IT)

(73) Assignee: Google Inc., Mountain View, CA (US)

( * ) Notice: Subject to any disclaimer, the term of this patent is extended or adjusted under 35 U.S.C. 154(b) by 813 days.

(21) Appl. No.: 11/631,111

(22) PCT Filed: Jun. 30, 2004

(86) PCT No.: PCT/EP2004/007102
§ 371 (c)(1),
(2), (4) Date: Dec. 29, 2006

(87) PCT Pub. No.: WO2006/002663
PCT Pub. Date: Jan. 12, 2006

(65) Prior Publication Data
US 2008/0298402 A1     Dec. 4, 2008

(51) Int. Cl.
*H01S 3/13* (2006.01)
(52) U.S. Cl.
USPC ........... 372/29.022; 372/107; 372/99; 372/36
(58) Field of Classification Search
USPC ................................. 372/29.022, 107, 36, 99
See application file for complete search history.

(56) References Cited

U.S. PATENT DOCUMENTS 5,712,723 A * 1/1998 Lee ................................ 359/328
6,205,159 B1   3/2001 Sesko et al.

(Continued)

FOREIGN PATENT DOCUMENTS

| JP | 62-298194 | 12/1987 |
| JP | 62298194 A * | 12/1987 |
| JP | 2000-012955 | 1/2000 |
| WO | WO 2004070893 A2 * | 8/2004 |

OTHER PUBLICATIONS

"Intel® C-Band Tunable Laser"; Performance and Design White Paper, pp. 1-12, (2003).

(Continued)

*Primary Examiner* — Jessica Stultz
*Assistant Examiner* — Joshua King
(74) *Attorney, Agent, or Firm* — Honigman Miller Schwartz and Cohn LLP

(57) ABSTRACT

An external-cavity tuneable laser includes a gain medium and a tuneable mirror wherein at least the tuneable mirror is in thermal contact with a thermally conductive platform. The tuneable mirror lays substantially horizontally on the thermally conductive platform significantly improving the thermal contact of the tuneable mirror with the platform. A laser beam from the gain medium is directed onto the tuneable mirror, which is mounted substantially horizontally with respect to the thermally conductive platform, by means of a deflector that deflects the beam or a large part of it toward one of the principal surfaces of the tuneable mirror. The resulting laser cavity is a folded cavity. The thermally conductive platform is preferably thermally coupled to a TEC that provides thermal control for the platform. The deflector may be a beam splitter that deflects part of the incoming light and transmits the remaining part. According to a preferred embodiment of the invention, the portion of light transmitted through the beam splitter forms the output laser beam, i.e., the external-cavity laser outputs a laser beam on the side of the wavelength selective elements (the tuneable mirror and, if any, the channel grid), i.e., on the side of the front facet of the laser diode.

30 Claims, 9 Drawing Sheets

U.S. PATENT DOCUMENTS

| | | |
|---|---|---|
| 6,215,928 B1 | 4/2001 | Friesem et al. |
| 6,400,739 B1* | 6/2002 | Auracher .................. 372/32 |
| 6,526,071 B1 | 2/2003 | Zorabedian et al. |
| 6,667,997 B2* | 12/2003 | Nasu et al. .................. 372/32 |
| 6,690,708 B2 | 2/2004 | Ishimaru |
| 6,724,797 B2 | 4/2004 | Daiber |
| 2002/0090017 A1 | 7/2002 | Hagberg et al. |
| 2002/0126345 A1 | 9/2002 | Green et al. |
| 2003/0007540 A1 | 1/2003 | Daiber |
| 2003/0152338 A1* | 8/2003 | Kuhara et al. .................. 385/89 |
| 2003/0231666 A1 | 12/2003 | Daiber et al. |
| 2005/0023573 A1* | 2/2005 | Govil et al. .................. 257/223 |

OTHER PUBLICATIONS

Chang et al.; "A Novel Low-Cost Tunable Laser Using a Tunable Liquid-Crystal Subwavelength Resonant Grating Filter"; Conference on Lasers and Electro-Optics, Optical Soc. of America, 2 pages, (2003).

Weiss et al.; "Tunable Porous Silicon Mirrors for Optoelectronic Applications"; Materials Research Society Symposium Proceedings. Vol. 737, pp. 539-534, (2002).

* cited by examiner

THERMALLY CONTROLLED EXTERNAL CAVITY TUNEABLE LASER

CROSS REFERENCE TO RELATED APPLICATION

This application is a national phase application based on PCT/EP2004/007102, filed Jun. 30, 2004, the content of which is incorporated herein by reference.

The invention concerns an external-cavity tuneable laser especially adapted for wavelength-division multiplexed optical communication networks.

RELATED ART

The use of lasers as tuneable light source can greatly improve the re-configurability of wavelength-division multiplexed (WDM) systems or of the newly evolved dense WDM (DWDM) systems. For example, different channels can be assigned to a node by simply tuning the wavelength. Also, tuneable lasers can be used to form virtual private networks based on wavelength routing, i.e., photonic networks.

Different approaches can be used to provide tuneable lasers, such as distributed Bragg reflector lasers, VCSEL lasers with a mobile top mirror, or external-cavity diode lasers. External-cavity tuneable lasers offer several advantages, such as high output power, wide tuning range, good side mode suppression and narrow linewidth. Various laser tuning mechanisms have been developed to provide external-cavity wavelength selection, such as mechanically adjustable or electrically activated intracavity selector elements.

U.S. Pat. No. 6,526,071 describes an external-cavity tuneable laser that can be utilised in telecom applications to generate the centre wavelengths for any channel on the International Telecommunications Union (ITU) grid. The disclosed tuneable laser includes a gain medium, a grid generator and a channel selector, both grid generator and channel selector being located in the optical path of the beam. The grid generator selects periodic longitudinal modes of the cavity at intervals corresponding to the channel spacing and rejects neighbouring modes. The channel selector selects a channel within the wavelength grid and rejects other channels.

In order to accommodate increasing optical communication traffic, DWDM systems with channel spacing of 50 GHz and eventually of 25 GHz are under development. DWDM systems with 50 GHz channel spacing typically require frequency accuracy of ±2.5 GHz, whereas systems with 25 GHz generally require an accuracy of ±1.25 GHz. As DWDM uses narrower channel spacing, accuracy and control in the positioning of the tuneable elements associated with the transmitter lasers over the entire tuning and operating temperature range has become an important issue. Non optimal positioning of tuneable elements results in spatial losses and reduced output power of the transmitter.

Spatial misalignments of optical components of the laser device may arise from temperature variations due to expansions and contractions associated to the various components, which will reduce wavelength stability and generally reduce the performance of the laser. The laser response needs to be stabilised across a relatively wide temperature range, typically ranging from −10 to 70° C. To ensure thermal stability, many telecommunication laser devices are mounted on a common platform, which exhibits high thermal conductivity and is subject to the thermal control of one or more thermo-electric coolers (TECs). Temperature control allows for maintenance of thermal alignment of the optical components.

In U.S. Pat. No. 6,724,797, an external-cavity laser device is disclosed, wherein selective thermal control is applied to optical components having a high susceptibility to thermal misalignments. The gain medium and the optical output assembly, which are temperature sensitive components, are mounted on a thermally conductive substrate. A TEC is coupled to the substrate to allow for the gain medium and the output assembly to be thermally controlled independently from the end mirror and other components of the external cavity laser. Components of the external cavity, which are thermally isolated from the thermally conductive substrate, may comprise a channel selector and a tuning assembly.

Applicants have noted that thermal stability of the channel selector and/or the ITU grid element can be crucial, especially if a large accuracy in wavelength positioning of the laser output is required.

A laser apparatus that uses active thermal adjustment of an external cavity laser in order to minimise cavity losses and provide wavelength stability is described in US patent application No. 2003/0231666. The disclosed apparatus comprises a gain medium thermally coupled to a thermally conductive platform. The platform is coupled to a TEC, which controls the temperature of the platform via thermal conduction.

Intel C-band tuneable laser, as described in *Intel® C-band Tunable Laser, Performance and Design White Paper*, published in May 2003 at www.intel.com/design/network/papers/TunableLaser.pdf, employs an etalon based, thermally actuated, tuneable filter to achieve single mode operation at selectable wavelengths. The wavelength filter comprises two silicon etalon filters with slightly different periods allowing for the "Vernier effect". The tuning filters are thermally actuated and any wavelength of the C-band can be addressed with a small temperature adjustment of the individual etalons. "Vernier" tuning of the output wavelength of an external-cavity laser to a selected wavelength on the wavelength grid is described also in US patent application No. 2002/0126345.

Applicants have observed that thermal tuning may require relatively long tuning time to fall within the selected wavelength, especially in case of wavelength switch occurring between non-adjacent channels. A relatively long tuning time can be incompatible with the always more stringent specifications of laser transmitters for WDM or DWDM applications, which may require tuning times of the order of few tens of ms.

Wavelength selection and tuning of a laser cavity can be performed by using an active tuneable mirror. An electro-optically controlled element employing liquid crystal and which can be used as an active tuneable mirror is disclosed in U.S. Pat. No. 6,215,928. The lasing wavelength of the laser is determined by the active tuneable mirror to be the resonance wavelength of the mirror. The resonant wavelength may be shifted by varying the voltage or current supplied to the electro-optically controlled element.

In "*A Novel, Low-cost Tunable Laser Using a Tunable Liquid-Crystal Subwavelength resonant Grating Filter*" by A. S. P. Chang et al., published in the Technical Digest, CTuM34, of the Conference on Lasers and Electro-Optics (CLEO), June 2003, a tuneable laser consisting of a gain medium and a tuneable liquid-crystal sub-wavelength resonant grating as a wavelength-selective mirror is disclosed.

Applicants have observed that temperature stabilisation of a tuneable mirror is especially desirable in case of tuneable mirror including a liquid crystal, as the properties of the liquid crystal may change due to thermal fluctuations.

When an external-cavity laser device is assembled, optical components in the laser cavity need to be carefully aligned with respect to the laser beam in order to make the external cavity adjusted for lasing and to reduce the cavity losses. Optical components in a tuneable laser for WDM and DWDM applications have generally to be positioned with a micron alignment tolerance or even with a sub-micron tolerance. For precision component alignment, passive or active optical alignment can be used. Component attachment during or after alignment can be carried out by laser welding or by using solders or glues.

Optical components can be fixed in optically aligned position in front of the laser with the help of holding and aligning members. Holding and aligning members are commonly fixed by laser welding to a platform. U.S. Pat. No. 6,690,708 describes a semiconductor laser module wherein the laser chip is fixed on the substrate and a first lens and an optical isolator are disposed between the laser chip and the optical fibre for receiving the light emitted from the laser chip. A lens holder fixed with the first lens and a housing fixed with the optical isolator are laser-welded and fixed to clamping parts of a lens holder retainer and an optical isolator retainer, respectively.

To avoid displacement shifts, holding and aligning members are commonly made of a material with low thermal expansion coefficient, such as Kovar®, Invar® 36 or Alloy 42.

JP patent application No. 2000-012955 discloses a self-injection synchronous laser having a phase-conjugated mirror for reflecting part of the output light to a beam splitter. Angle and distance adjustments of the mirror are said to be unnecessary because the phase-conjugated mirror returns light that does not change when the optical distance varies.

SUMMARY OF THE INVENTION

The present invention relates to an external-cavity tuneable laser including a gain medium and a tuneable mirror, wherein at least the tuneable mirror is in thermal contact with a thermally conductive platform.

Preferably, the gain medium is a semiconductor gain chip. The laser diode is preferably placed on a thermally conductive base in order to dissipate the heat generated within the laser diode during operation. More preferably, both the gain medium and the tuneable mirror are placed on the same thermally conductive platform to further improve the accuracy of the optical alignment.

Preferably, the tuneable laser comprises a channel allocation grid element. The channel allocation grid element is preferably a Fabry-Perot (FP) etalon, which is structured and configured to define a plurality of equally spaced transmission peaks. In applications for WDM or DWDM telecommunication systems, transmission peak spacing, i.e., the free spectral range (FSR) of the grid element, corresponds to the ITU channel grid, e.g., 200, 100, 50 or 25 GHz.

When present in the laser cavity together with the channel allocation grid element, the tuneable mirror serves as the coarse tuning element that discriminates between the peaks of the channel allocation grid element. For single-mode laser emission, a longitudinal cavity mode should be positioned over the maximum of one of the grid transmission peaks (the one selected by the tuneable mirror). In this way, only the specified frequency will pass through the grid and the other competing neighbouring cavity modes will be suppressed. Wavelength selectivity of the tuneable mirror is preferably achieved by an electrical signal. The tuneable mirror of the present invention preferably comprises an electro-optically tuneable material, more preferably a liquid crystal (LC) material.

The tuneable mirror has two principal surfaces, which are preferably substantially parallel one another. One of the two principal surfaces receives the incident beam. In a preferred embodiment, the tuneable mirror includes a substrate, a planar waveguide formed on the substrate and a diffraction grating optically interacting with the waveguide. The diffraction grating and the planar waveguide form a resonant structure. A cladding layer made of electro-optically tuneable material is placed on the planar waveguide.

Applicants have noted that when mounting a tuneable mirror in front of the gain medium, microrad alignment accuracy is often required. In order to align and hold in place the tuneable mirror with respect to the laser beam, employment of a holding member housing the tuneable mirror would be highly desirable so as to keep the tuneable mirror in a substantially orthogonal position with respect to the laser beam. Active optical alignment and fixing by laser welding allow achieving the desired alignment tolerances and a long-term mechanical stability. Attachment of the holding member by means of glues, such as epoxies or solders, is less preferable because glues or solders may not guarantee reproducibility and long-term mechanical stability.

Materials with high thermal conductivity are generally not suitable for laser welding because the heat swiftly dissipates away from the heat source (i.e., the weld area), thereby yielding to a relatively large weld melt pool. Ideally, metals with low thermal conductivity, together with a low thermal expansion coefficient, are well suited to be laser welded. Many metal alloys fall into this category, such as, platinum alloy, Kovar®, Invar®, Alloy 42 and berillium copper.

A low thermal expansion coefficient for the materials making the supporting structures for optical elements aligned to the laser beam is desirable to minimise the misalignments due to thermal fluctuations, which may occur at a small scale in a laser package also when a TEC is used to stabilise the temperature.

Applicants have observed that thermal contact between the tuneable mirror and the thermally conductive platform would be considerably inhibited if a supporting member having a low thermal conductivity (e.g., made of a material suitable for laser welding) is placed in between the mirror and the platform. They have remarked that temperature stabilisation of the tuneable mirror is crucial, especially in case of tuneable mirror including a liquid crystal, as the properties of the liquid crystal may change due to thermal fluctuations. Preferably, thermal fluctuations in the tuneable mirror should not exceed 0.5° C. in a temperature range from −10 to 70° C. in order to minimise wavelength and power drift during laser operation. In a preferred embodiment, thermal fluctuations within 0.2° C. correspond to frequency shifts not larger than about ±4 GHz, which are generally acceptable for channel spacing of 50 GHz.

Applicants have found that by laying the tuneable mirror substantially horizontally on the thermally conductive platform significantly improves the thermal contact of the tuneable mirror with the platform. A substantial horizontal position of the tuneable mirror on the platform means in this context that the mirror lays with one of its principal surfaces either along the same plane of a platform principal surface or within few degrees to the plane of a platform principal surface. It is to be understood that the tuneable mirror can be either in direct contact with the thermally conductive platform or a substrate (or holder) made of thermally conductive material can be placed between the tuneable mirror and the platform.

The laser beam from the gain medium is directed onto the tuneable mirror, which is mounted substantially horizontally with respect to the thermally conductive platform, by means of a deflector that deflects the beam or a large part of it towards one of the principal surfaces of the tuneable mirror. The resulting laser cavity is therefore a folded cavity.

The tuneable mirror can be directly mounted on the thermally conductive platform without the need of aligning it to the laser beam and in particular without the need of making use of a supporting structure suitable for alignment. For instance, the tuneable mirror is fixed on the platform by gluing its back (principal) surface to the platform or to a mirror holder/substrate fixed to the platform. The tuneable mirror in turn can be glued to the holder/substrate. Alternatively, at least part of the back surface of the tuneable mirror or of the mirror holder/substrate can be metallised, e.g., gold-plated, and then soldered to the surface of the platform.

Within the laser design according to the present invention, what needs to be aligned to the laser beam, preferably by employing active optical alignment, is the deflector. Holding and aligning structures with low thermal conductivity, which would be generally necessary to enclose or support the tuneable mirror during alignment, are now unneeded as no alignment to the laser beam is necessary. Consequently, a good thermal contact between the tuneable mirror and the thermally conductive platform can be achieved.

The thermally conductive platform is preferably thermally coupled to a TEC that provides thermal control for the platform.

In a preferred embodiment, the deflector is a beam splitter that deflects part of the incoming light and transmits the remaining part. Applicants have found that by using a beam splitter as deflector a more compact laser assembly can be envisaged. According to a preferred embodiment of the invention, the portion of light transmitted through the beam splitter forms the output laser beam. In other words, the external-cavity laser outputs a laser beam on the side of the wavelength selective elements (the tuneable mirror and, if any, the channel grid), i.e., on the side of the front facet of the laser diode. With this laser design, a collimating lens to collimate the output laser beam is not necessary, as the intra-cavity collimating lens functions as collimating lens for both the beam emitted from the gain medium and the beam transmitted through the beam splitter, which is coupled to the output optics, e.g., an optical fibre. Preferably, the beam splitter has a transmittance in the range of 70-90% so as to ensure a relatively high laser output power.

When the output light is emitted from the reflecting rear facet of the semiconductor gain chip (the gain medium), which forms one of the end mirrors of the laser external cavity, power control of the laser output is generally carried out by placing a partial deflector, e.g., a beam splitter, outside the laser cavity in front of the laser diode. The deflector diverts the output light onto a monitor photodetector just prior to fibre coupling. Applicants have noted the following. The rear facet of the laser diode typically exhibits a transmittance of about 80-90% so as to effectively function as end mirror for the external cavity. If a beam splitter is placed to deflect the beam emitted from the rear facet for power monitoring, the portion of the beam intensity spilled from the optical output should be as small as possible not to penalise the output power. For example, the beam splitter in front of the laser diode can have a split ratio of 98%/2%, i.e., 2% of the beam intensity constitutes the test beam directed to the photodetector. Consequently, the optical power incident on the photodetector is relatively low, which may come at the cost of the accuracy in power monitoring. A relatively low optical power of the test beam is particularly disadvantageous if wavelength calibration of the laser beam is to be carried out by using an optical control system that analyses, by means of at least a photodetector, light filtered through a filter having a wavelength-dependent transmittance or gain attenuation.

Applicants have found that by using a beam splitter as deflector in the laser cavity, the light transmitted by the beam splitter can be monitored by one or more photodetectors. This is particularly advantageous in case of a laser assembly design configured so that the laser output light originates from the light transmitted through the beam splitter. In this case, the photodetector(s) receive a light beam having almost the same intensity of the output beam. Especially if the transmittance of the beam splitter is selected in the range 70-90%, monitoring can be carried out by analysing a beam with a relatively high optical power. Furthermore, monitoring can be implemented without adding further deflecting optical elements to drop off a test beam. The photodetector(s) can be placed so as to receive the light substantially orthogonal to the output beam. The photodetectors, e.g. photodiodes, can be for instance placed on one of the surfaces of the beam splitter, which does not face the tuneable mirror and does not receive the laser beam originating from the gain medium.

Preferably, all elements of the laser assembly are mounted on a common thermally conductive platform. In a preferred embodiment, the output optics, which includes the focussing lens and the optical fibre, is integral to the laser assembly, i.e., the output optics is mounted on the platform on which the laser assembly is mounted.

Preferably, the tuneable laser has a relatively short cavity length, i.e., not more than 12 mm.

Tuning time of the thermally controlled laser system according to the present invention can be lower than 0.20 ms.

DETAILED DESCRIPTION

Figure 1:
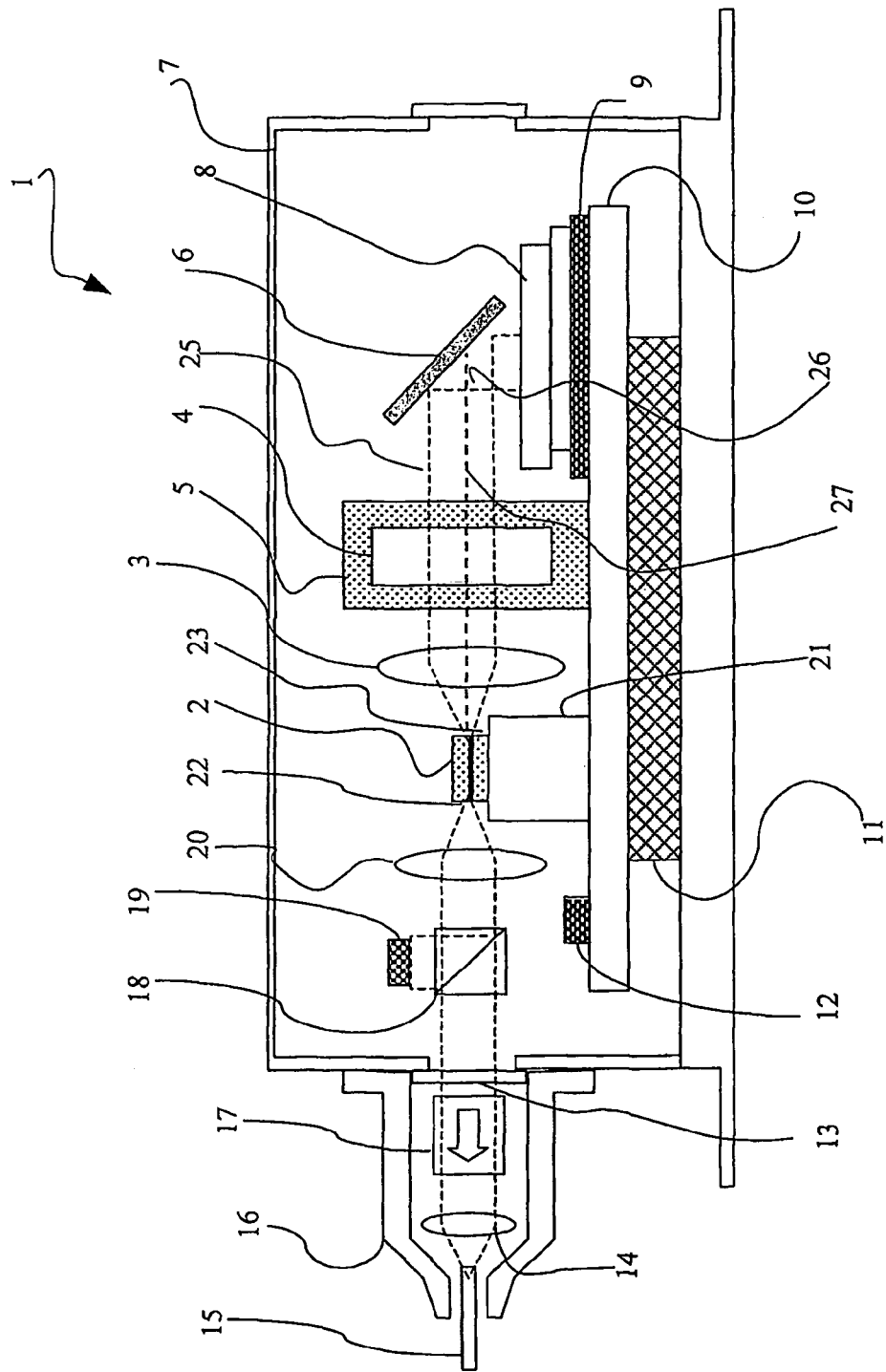
FIG. 1 is a schematic view of the tuneable laser according to a first embodiment of the present invention.

A tuneable laser system according to a preferred embodiment of the present invention is schematically depicted in FIG. 1. The laser system 1 comprises a laser assembly that fits in a package 7, e.g., a 14-pin butterfly package, which comprises a boot 16 for the insertion of an optical fibre, i.e., fibre pigtail 15. A glass window 13 closes up hermetically the laser assembly from the boot for fibre insertion. The laser assembly includes a gain medium 2, a collimating lens 3, a channel allocation grid element 4, a deflector 6 and a tuneable mirror 8. The laser system comprises a thermally conductive platform 10. The gain medium 2 is based on a semiconductor diode, for example an InGaAs/InP multiple quantum well Fabry-Perot (FP) gain chip especially designed for external-cavity laser applications. The diode comprises a back facet 22 and a front facet 23. The diode's front facet 23 is an intracavity facet and has an anti-reflection coating. Preferably, the gain chip waveguide is bent so that it has an angled incidence on the front facet in order to further reduce back reflections. The back facet 22 is partially reflective and serves as one of the end mirrors of the external cavity. The reflectivity of the back facet can range for instance between 10% and 30% in order to allow a relatively high laser output power.

Within the laser cavity, the emerging beam from the diode front facet 23 is collimated by collimating lens 3 that collimates the beam to define an optical path 25. The collimated beam impinges onto a channel allocation grid element 4.

The channel allocation grid element 4 is preferably a FP etalon, e.g., a solid or an air-spaced etalon. The laser can be designed in such a way that the operating wavelengths are aligned with the ITU channel grid. In this case, the laser wavelength is centred to the ITU grid via the FP etalon 4, which is structured and configured to define a plurality of equally spaced transmission peaks. In applications for WDM or DWDM telecommunication systems, transmission peak spacing, i.e., the FSR of the grid element, corresponds to the ITU channel grid, e.g., 200, 100, 50 or 25 GHz.

Preferably, the collimating lens 3 is placed in the cavity substantially orthogonal to the optical path 25. Preferably, the FP etalon 4 is placed in the cavity with a slight inclination angle, e.g., 0.5°, to the perpendicular to the optical path 25 in order to keep the reflected light of the FP etalon from returning to the laser diode.

After the FP etalon 4, the laser beam strikes a deflector 6 that deflects the beam 25 onto a tuneable mirror 8 along optical path 26. The tuneable mirror 8 reflects the light signal back to the deflector 6, which in turn deflects the light signal back to the gain medium 2. The deflector 6 is in this embodiment a planar mirror, for instance a gold-coated silicon slab.

Although not shown in FIG. 1, the deflector 6 can be housed in a holder that can be fixed to the thermally conductive platform 10 by known techniques. Preferably, the deflector is aligned to the laser beam by means of active optical alignment techniques.

The tuneable mirror 8 is an electro-optic element, in which tuneability is achieved by using a material with voltage-dependent refractive index, preferably a liquid crystal (LC) material. The tuneable mirror serves as the coarse tuning element that discriminates between the peaks of the FP etalon. The FWHM bandwidth of the tuneable element is not smaller than the FWHM bandwidth of the grid etalon. For longitudinal single-mode operation, the transmission peak of the FP etalon corresponding to a particular channel frequency should select, i.e., transmit, a single cavity mode. Therefore, the FP etalon should have a finesse, which is defined as the FSR divided by the FWHM, which suppresses the neighbouring modes of the cavity between each channel. For single-mode laser emission, a longitudinal cavity mode should be positioned over the maximum of one of the etalon transmission peaks (the one selected by the tuneable element). In this way, only the specified frequency will pass through the etalon and the other competing neighbouring cavity modes will be suppressed. The electrical signal provided for the functioning of the tuneable mirror including a LC material is an alternating voltage in order to prevent deterioration of the LC due to dc stress.

Figure 2:
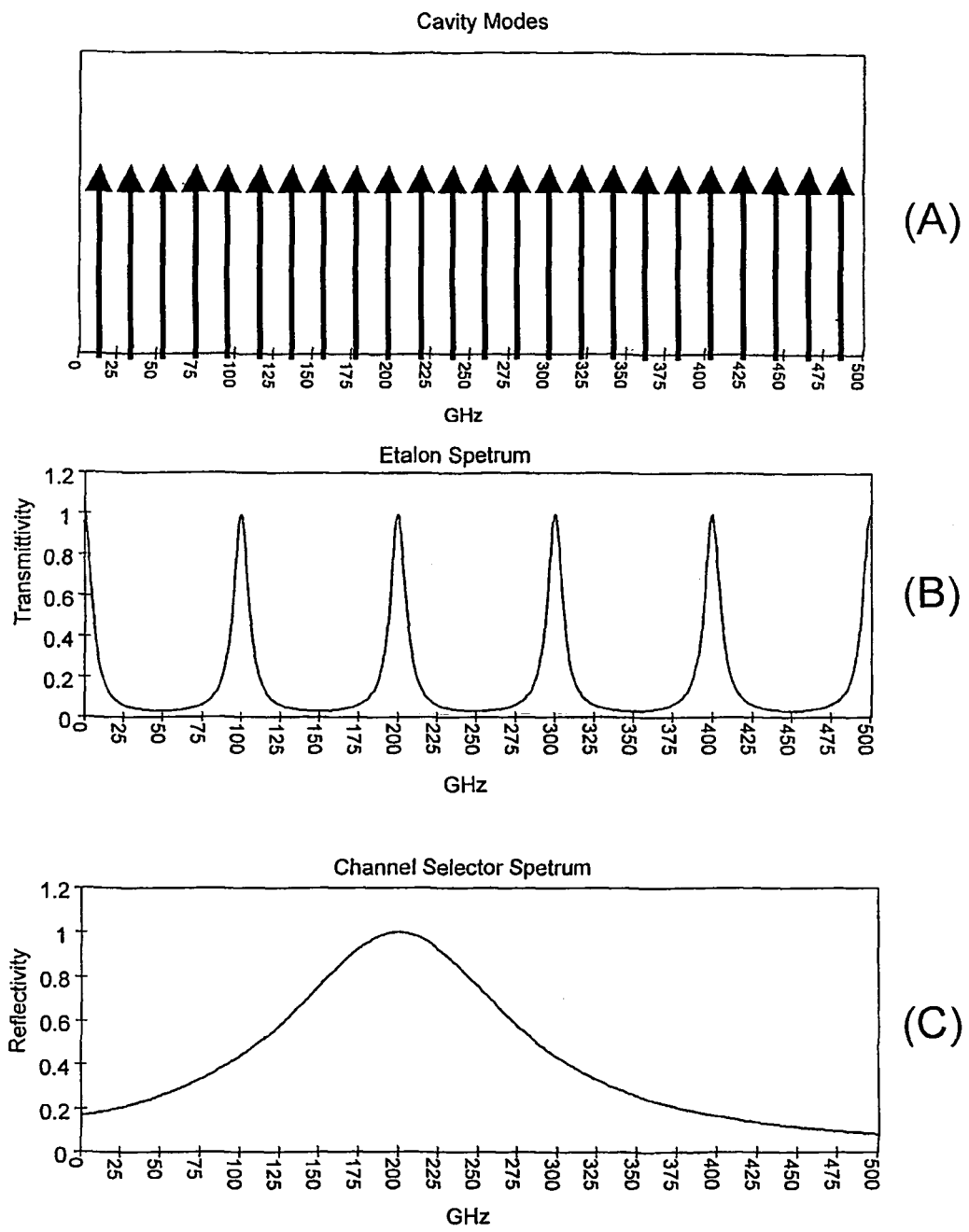
FIG. 2 is a graphical illustration of the external longitudinal cavity modes (A), of the transmission modes of the channel allocation grid (B), and of the bandwidth of the channel selector, i.e., the tuneable mirror (C).

FIG. 2 is a diagram illustrating the various modes within a laser cavity comprising a FP etalon having a plurality of pass bands aligned to the ITU channel grid as spectrally selective loss element. In (A) the cavity modes induced by the resonant external cavity are shown; in (B) the modes of the FP etalon having the positions of the peaks locked to the standard ITU grid, and (C) is the pass band of the tuneable element, i.e., the tuneable mirror. In the illustrated example the FSR of the grid FP etalon corresponds to the spacing between the grid lines of the 100 GHz ITU grid.

Referring back to FIG. 1, the laser cavity is a folded resonant cavity having an optical path length, which is the sum of the optical path 25 between the deflector 6 and the back facet 22 of the gain medium and the optical path 26 between the deflector and the tuneable mirror 8.

The laser beam is coupled out of the external cavity by the partially reflective back facet 22 of the laser diode 2. Preferably, a collimating lens 20 can be placed along the optical path of the laser output beam. In the present embodiment, a beam splitter 18, e.g. a 98%/2% tap, which is placed after lens 20, picks off a portion of the output light as a test beam, which is directed to a photodetector 19 for power control. A fibre focus lens 14 directs the light, which has passed through an optical isolator 17, into fibre pigtail 15. Optical isolator 17 is employed to prevent back-reflected light being passed back into the external laser cavity and is generally an optional element.

In the preferred embodiments, the laser assembly is designed to produce substantially single longitudinal and, preferably, single-transversal mode radiation. Longitudinal modes refer to the simultaneous lasing at several discrete frequencies within the laser cavity. Transversal modes correspond to the spatial variation in the beam intensity cross section in the transverse direction of the lasing radiation. Generally, an appropriate choice of the gain medium, e.g., a commercially available semiconductor laser diode including a waveguide, guarantees single spatial, or single transversal, mode operation.

The laser is configured to emit an output radiation at a selected one of a plurality of equally spaced output frequencies that match the equally spaced channel frequencies in a WDM or DWDM system. The laser is operative to emit a single longitudinal mode output, which depends on the spectral response of the optical elements within the cavity and on the phase of the cavity.

The laser assembly is based on a common thermally conductive platform 10 that functions as mechanical reference base for the optical elements. The use of a common optical bench is preferred because it minimises the design complexity and simplifies the alignment between the components of the tuneable laser. The platform 10 can be made of any thermally conductive material, such as aluminium nitride (AlN), silicon carbide (SiC) and copper-tungsten (CuW).

Although not shown in FIG. 1, lenses 3 and 20 are mounted to the platform by individual mounts.

The tuneable mirror 8 lays substantially horizontally with respect to the principal surface plane of the thermally conductive platform 10. In a preferred embodiment, the tuneable mirror is placed onto a thermally conductive substrate or in a holder (indicated with 9 in FIG. 1) that can house the tuneable mirror. In case the platform 10 is made of a metallic material, the substrate or holder 9 should be made of an electrically insulating material (with high thermal conductivity) in order to avoid an electrical contact between the tuneable mirror and the platform, as the tuneable mirror is normally biased during laser operation. In a preferred embodiment, the holder 9 is made of AlN or SiC.

By laying the tuneable mirror horizontally on the platform, the thermal contact with the platform is maximised while there is no need of actively aligning the mirror with respect to the laser beam during laser assembly. Preferably, during laser assembly, the tuneable mirror is bonded onto the thermally conductive platform by means of a thermally conductive epoxy, for instance Ag-filled epoxy, or of silicone resin. Alternatively, the tuneable mirror is housed in a holder or placed on a substrate that is bonded to the thermally conductive platform. The mirror can be glued to the substrate or holder.

What needs to be aligned to the laser beam, preferably by optical active alignment techniques, is the deflector 6. The deflector can be secured in the cavity for instance by means of a support structure that is fixed to the platform 10 (not shown in FIG. 1). The deflector can be glued to the support structure or, if it is at least partly metallised, soldered.

In case the thermally conductive platform is made of a reflecting material, e.g., an Au-plated ceramic base, a FP cavity can be created between the tuneable mirror and the platform, which gives rise to spurious reflections in the laser external cavity. In order to minimise this problem, it is preferred to slightly tilt the tuneable mirror with respect to the main upper surface of the platform so that a small angle, e.g., 0.5° or 1°, is formed between the plane of a principal surface of the tuneable mirror and the plane along the platform surface. Alternatively, the reflectivity of the platform surface can be reduced at least in the region under and surrounding the tuneable mirror by roughening the surface of the platform, e.g., by laser cutting.

In order to stabilise its temperature, the FP etalon 4 is preferably housed in a thermally conductive housing 5 to promote thermal contact with the platform 10. The etalon's housing 5 exhibits preferably a thermal conductivity not smaller than 150 W/mK and is soldered directly on the platform, e.g., by dye attach using an Ag-filled epoxy resin, a low-temperature solder alloy or thermally conductive epoxies. For example, the etalon holder can be made of CuW alloy. When the FP etalon or its holder, if any, is glued or soldered to the platform, adjustments of the etalon's optical alignment with respect to the laser beam can be carried out by actively aligning the collimating lens 3.

Collimating lens 3 can be mounted to the platform 10 by a supporting structure (not shown), which may serve also for alignment of the lens to the laser beam.

The gain chip 2 is preferably placed, e.g., by bonding, on a thermally conductive sub-mount 21 so as to position the emitted beam at a convenient height with respect to the other optical elements and to further improve heat dissipation. The thermally conductive sub-mount 21 is placed on the thermally conductive platform 10.

The thermally conductive platform 10 is preferably thermally coupled to a TEC 11 that provides thermal control for the platform. For instance, the platform 10 can be glued or soldered to the TEC 11. Temperature monitoring of the thermally conductive platform is provided by a thermal sensor device 12, such as a thermistor or a thermocouple, which is placed on the platform and is operatively coupled to the TEC so as to provide control signals to cool or heat platform 10. Additional thermal sensors devices can be optionally placed on one or more optical elements of the laser assembly, for instance the tuneable mirror or the FP etalon, if specific thermal control of the optical elements is desired.

Numerical simulations have shown that maximum temperature variations of the laser assembly remain lower than 0.1° C. across the temperature operating range from −10 to 70° C., even when the dissipated power of the tuneable mirror, which is due to the applied voltage, is as high as 50 mW.

Figure 3:
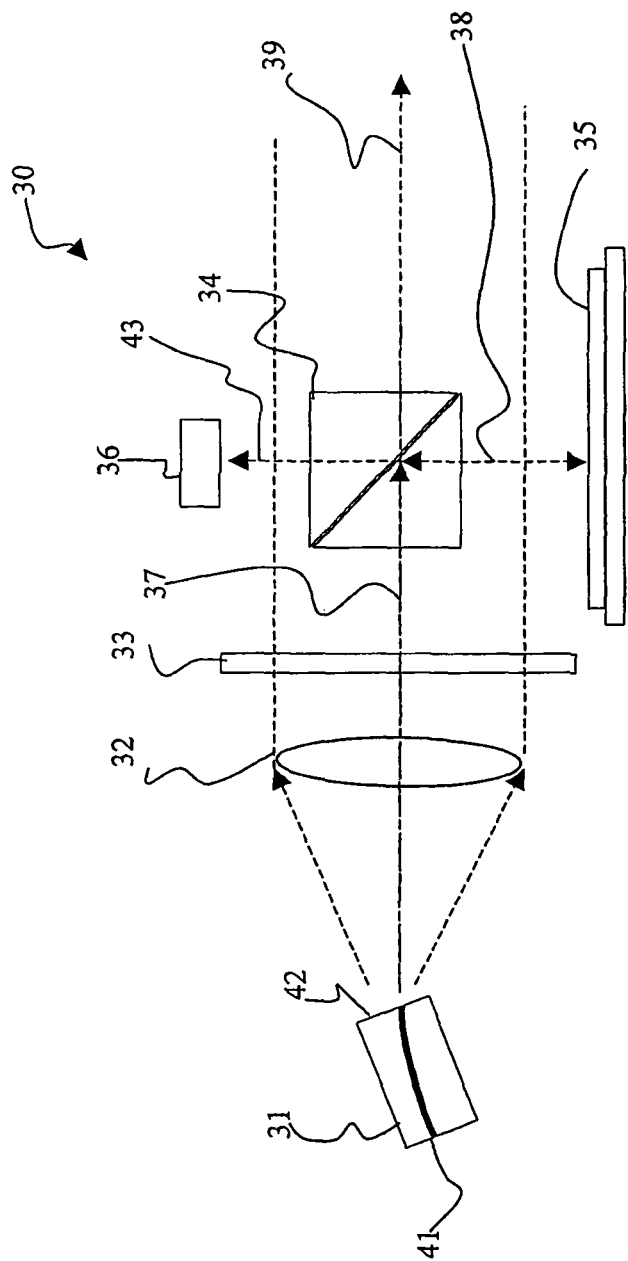
FIG. 3 is a block diagram of the laser assembly according to a second embodiment of the present invention.

FIG. 3 is a schematic illustration of a laser assembly according to a second preferred embodiment of the present invention. The laser assembly 30 comprises a gain medium 31, a collimating lens 32, a FP etalon 33, a deflector 34 and a tuneable mirror 35. The gain medium 31 is based on a semiconductor diode, which comprises a back facet 41 and a front facet 42. The diode's front facet 42 is anti-reflection coated, whereas the back facet 41 is party reflective. Preferably, the gain medium is a semiconductor gain chip with a gain chip waveguide that is bent so that it has an angled incidence on the front facet in order to further reduce back reflections. The deflector of the folded laser cavity according to this second embodiment is a beam splitter (BS) 34. The light emitted from the gain medium 31 is collimated by collimating lens 32 and passes through the FP etalon 33. After having passed through the FP etalon, light travelling along optical path 37 impinges the BS 34, where it is partially diverted to the tuneable mirror 35 along path 38. Most of the light impinging the tuneable mirror (depending on the reflectivity of the tuneable mirror) is reflected back to the BS, which in turn returns a portion of it to the laser diode. The laser external cavity is a folded cavity having an optical path with is the sum of optical paths 37 and 38. The back facet of the laser diode 41 and the rear surface of the tuneable mirror 40 form the end mirrors of the laser external cavity.

The BS thus reflects a portion of the incident laser beam 37, which is deflected to the tuneable mirror and then fed back to the BS, which returns it to the laser diode. The remaining (preferably substantial) portion of the light is transmitted by the BS in the direction of optical path 39 and constitutes the laser output beam. Preferably, a transmission axis of the BS 39 is substantially parallel to the optical axis of the laser beam, i.e., optical path 37. For instance, the BS is a cube beam splitter that reflects at 90° the incident beam. Preferably, the BS is insensitive to the polarisation of the incident light.

Within this laser design, the BS 34 has preferably a relatively high transmittance, preferably in the range between 70% and 90% so as to ensure a relatively high output laser power. An optimal value of transmittance of the beam splitter can be selected as a trade-off between minimisation of cavity losses and of gain ripple. The reflectivity of the back facet 41 of the laser diode 31 is preferably of about 100%. It is to be noted that although in this preferred embodiment the fraction of the light reflected from the BS appears to be small, a good laser amplification in the laser external cavity can be achieved by selecting a high-power gain medium, e.g., a semiconductor gain chip with differential gain as least 200 cm$^{-1}$.

According to the embodiment of FIG. 3, a second transmission axis of the BS is substantially perpendicular the incident beam. The optical beam transmitted through the BS along optical path 43 can be used as test beam for monitoring the output power, by simply placing a photodetector 36, e.g., a photodiode, along optical path 43. For instance, a semiconductor photodiode can be directly attached to the BS component by means of glue or solder.

The photodiode 36 receives a light beam having about the same intensity of the laser output beam along path 39. Power monitoring in the laser design of FIG. 3 has the advantage that a relatively large fraction of the laser beam is detected by the photodetector, thereby increasing the accuracy of the control of the power variations or fluctuations during laser operation.

Figure 4:
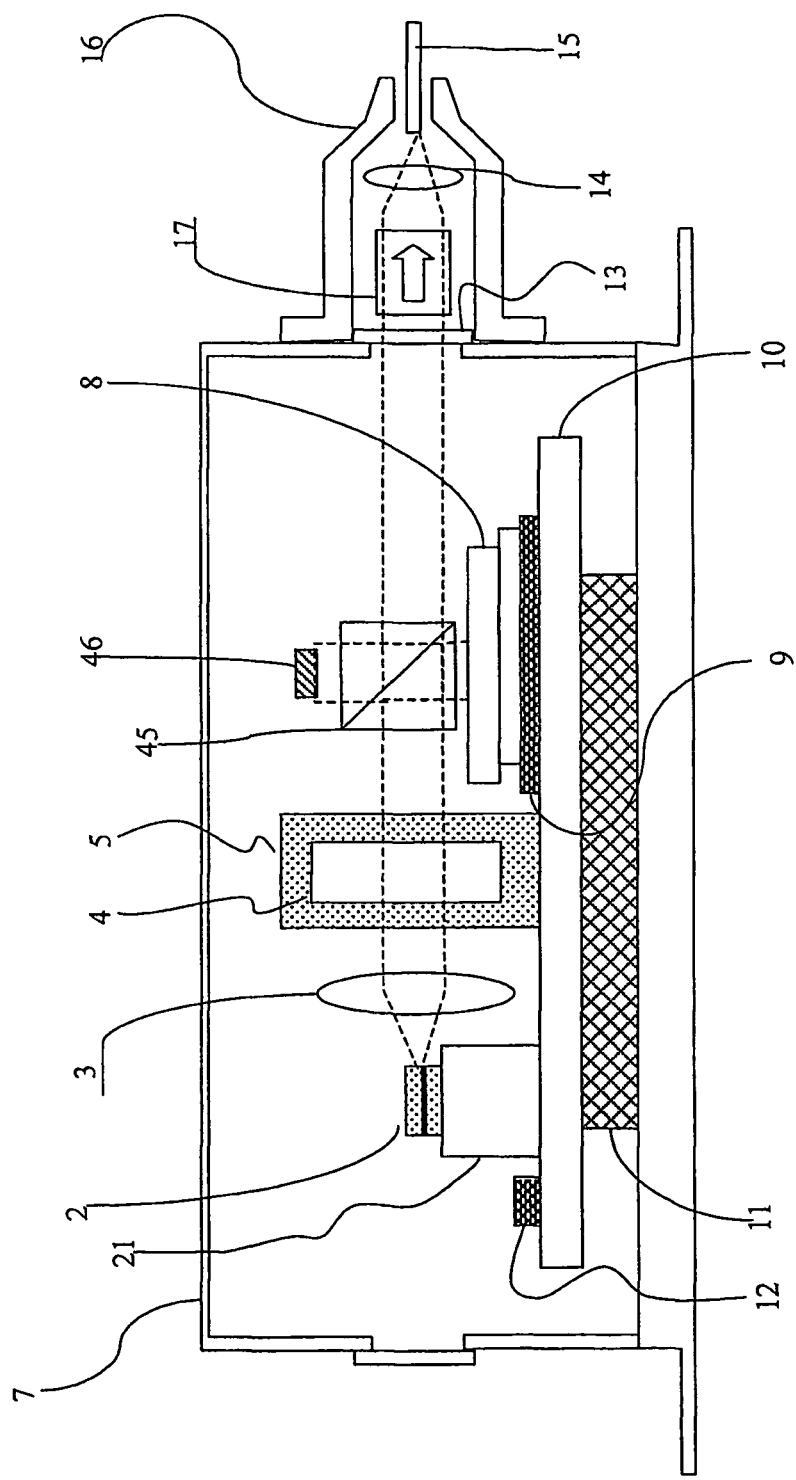
FIG. 4 is a schematic view of the tuneable laser according to a third embodiment of the present invention.

FIG. 4 illustrates a laser system according to a third embodiment of the present invention. The same reference numerals are given to elements of the tuneable laser corresponding to those shown in FIG. 1 and their detailed explanation will be omitted.

After having passed through the FP etalon 4, light impinges on the beam splitter (BS) 45, where it is partially diverted to the tuneable mirror 8. A photodetector 46 receives the portion of the laser light, which has been returned by the tuneable mirror to the BS and then transmitted through the BS, as test beam for power monitoring.

The laser light transmitted through the BS 45 along the direction of the optical axis of the laser beam, i.e., the laser output beam, is directed through optical isolator 17 and then focussed by lens 14 into an optical fibre 15. It is important to note that the design of the laser cavity according to the embodiment of FIG. 4 has the advantage of improving the compactness of the cavity as a second collimating lens to collimate the output beam to the optical output assembly for the coupling into the optical fibre (lens 20 in FIG. 1) is not necessary. Moreover, if power monitoring is to be realised, a further BS for spilling out the output power is not necessary.

Preferably, in the laser design of FIG. 4, the rear facet of the laser diode has a reflectivity larger than 90% and the front facet with reflectivity lower than $10^{-3}$ in order to minimise gain ripple that can lead to laser emission in non-selected channels.

Figure 5A:
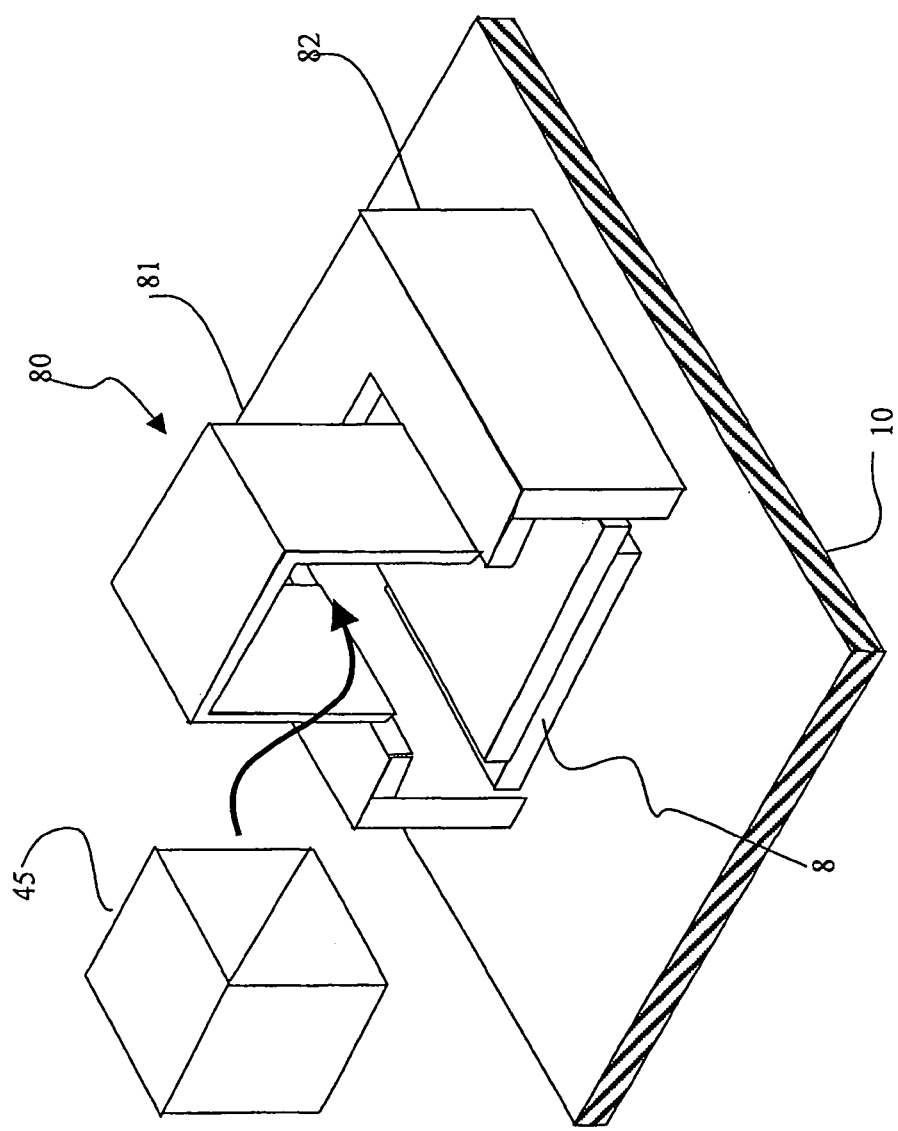
FIG. 5(a) illustrates the supporting structure for the deflector in the laser system according to an embodiment of the present invention.
Figure 5B:
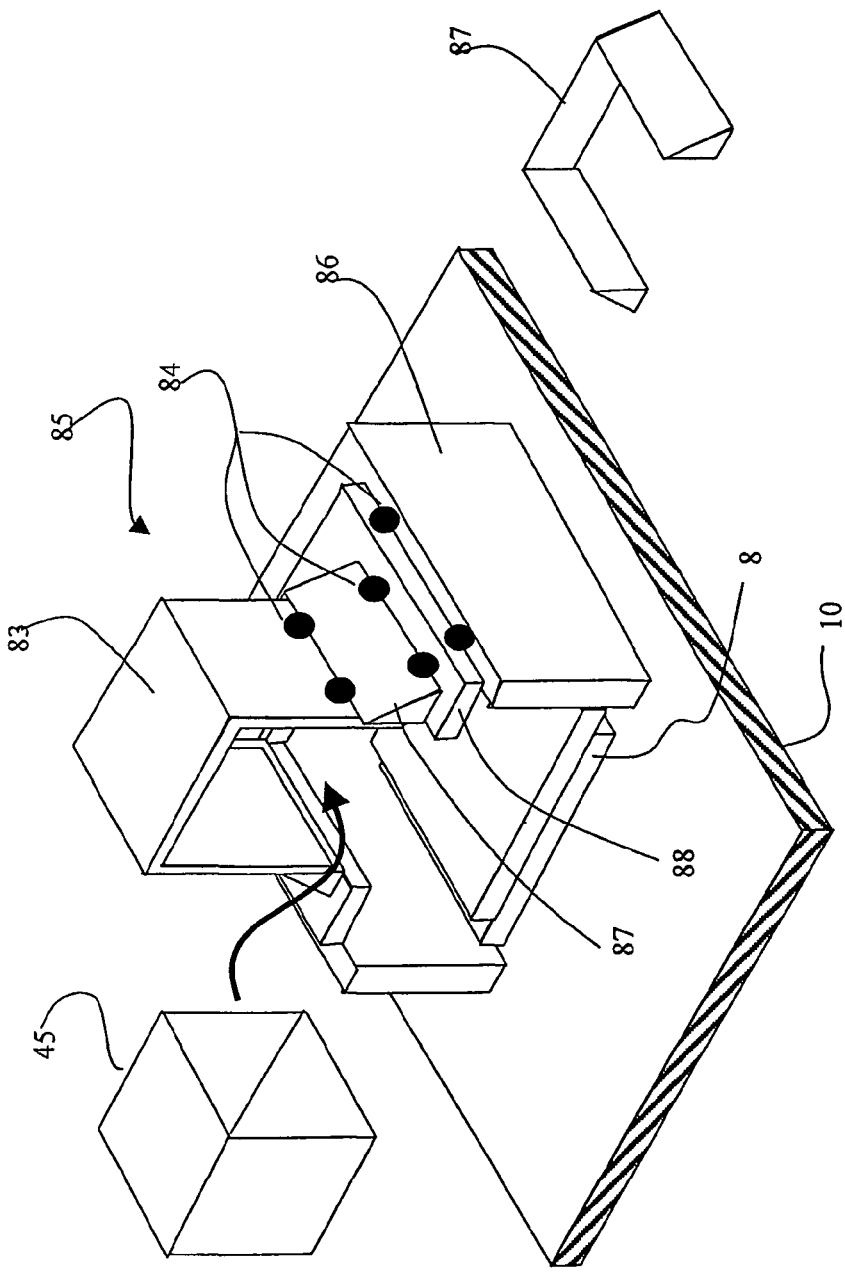
FIG. 5(b) illustrates the supporting structure for the deflector in the laser system according to another embodiment of the present invention.

FIGS. 5(*a*) and 5(*b*) illustrate two possible supporting structures for the beam splitter 45 of FIG. 4. In this embodiment, the BS is a cube beam splitter. It is to be understood that the supporting structures can be used to hold and fix in place the beam splitter according to the other embodiments of the present invention. Similar supporting structures can be used also to hold and fix in place the planar mirror of FIG. 1. In FIG. 5(*a*), support structure 80 is composed by a U-shaped holder 81 to retain the beam splitter 45 and by a U-shaped rectangular frame 82, which is mounted and fixed in place on thermally conductive platform 10. The beam splitter 45 can be attached to the holder 81 beforehand by epoxy or glue. Holder 81 can be fixed to rectangular frame 82 after alignment with respect to the laser beam. The inner side of the rectangular frame 82 is open to leave space for the tuneable mirror 8 that lays horizontally on platform 10. The rectangular frame 82 surrounds the tuneable mirror 8, whereas the holder 81 is placed above the tuneable mirror.

FIG. 5(*b*) illustrates an alternative supporting structure for the BS 45. Supporting structure 85 comprises a U-shaped holder 83 to hold beam splitter 45 and U-shaped rectangular frame 86, which surrounds the tuneable mirror 8. Holder 83 and rectangular frame 86 are fixed one another by means of U-bolt 87 and U-bolt support 88. For sake of clarity, U-bolt 87 is also illustrated separated from the other parts of the supporting structure. Parts of the supporting structure 85 are fixed by laser welding through weld spots 84. The beam splitter 45 can be attached to holder 83 beforehand by epoxy or glue. Supporting structure 85 allows alignment with 5 degrees of freedom (three axial and two radial) after having fixed the U-shaped rectangular frame 86 to the platform 10. The rectangular frame 86 can be attached to the platform by glues, solder or by laser welding.

Alignment of the beam splitter by means of supporting structures 80 or 85 is preferably carried out by methods of active optical alignment, which are known per se.

Supporting structures of FIGS. 5(*a*) and 5(*b*) are given by way of example and it is to be understood that a number of different geometrical configurations for the supporting structure of the deflector are possible.

In a preferred embodiment, the tuneable mirror is an electro-optical element that includes a waveguide formed onto a substrate and a diffraction grating formed onto the waveguide, for instance of the same material of the waveguide. Over the diffraction grating a cladding layer that fills at least the interstices of the diffraction grating is formed. The cladding layer is made of a liquid crystal material having a wide range of electrically selectable indices of refraction. Two conductors, at least one of which being transparent, are placed on opposite surfaces of the liquid crystal layer. A voltage or current source is coupled across the two transparent conductors. An example of the structure of the tuneable mirror is given in U.S. Pat. No. 6,215,928. Depending on the voltage or current across the voltage applied to the conductors, the tuneable mirror reflects radiation only at a given wavelength ($\lambda_{TM}$). Radiation at all other wavelengths passes through the tuneable mirror. Thus, the tuneable mirror functions both as tuneable selector element and as cavity end mirror. The tuneable mirror is driven with an alternating voltage $V_{TM}$ to prevent deterioration of the liquid crystal due to dc stress. The frequency of the applied voltage may range from 20 kHz to 200 kHz. The spectral response of the tuneable mirror is a spectral line, with a lineshape for example similar to that of a Lorentzian curve, centred at $\lambda_{TM}$, having a $(FWHM)_{TM}$ bandwidth that may range from about 50 GHz to about 250 GHz, preferably ranging between 70 and 100 GHz. In a particular embodiment, the $\lambda_{TM}$ can be tuned over an 80 nm range.

The lasing output wavelength of the laser, i.e., the lasing channel, is selected to correspond to the resonance wavelength $\lambda_{TM}$ of the tuneable mirror, which in turn corresponds to a value of amplitude of the voltage applied to the tuneable mirror, $V_{TM}$. In other words, selection of the emission wavelength (frequency) of the tuneable laser by the tuneable mirror is achieved by selecting a corresponding value of applied voltage $V_{TM}$. Fine wavelength adjustments can be can be derived from the analysis of the laser output power, e.g., by slightly varying the voltage $V_{TM}$ applied to the tuneable mirror and by seeking the maximum in the output power. Preferably, the AC component of the optical power at the laser output and its related phase are measured to evaluate the magnitude and the sign of the wavelength difference between the cavity mode wavelength $\lambda_{CM}$ and the peak wavelength of the tuneable mirror $\lambda_{TM}$, i.e., $\Delta\lambda = \lambda_{CM} - \lambda_{TM}$. In order to reduce or to cancel the wavelength difference $\Delta\lambda$, minimisation of the AC component of the optical power is sought by changing the voltage $V_{TM}$.

For mode stabilisation in the laser cavity alignment of the cavity mode at $\lambda_{CM}$ with the centre of the etalon's transmission peak at $\lambda_{FP}$ should be attained. A closed-loop control for aligning the lasing mode with the selected etalon peak can be carried out by for example adjusting the injection current, $I_{LD}$, of the gain medium, e.g., the laser diode. A change in the injection current of the laser diode induces a change in the refraction index of the gain medium and thus a variation in the phase of laser output. Centring of the etalon peak with the cavity mode can be obtained by adjusting $I_{LD}$ and by monitoring the laser output power. An algorithm that maximises the laser output power can be implemented for fine tuning of the cavity mode under the peak of the etalon mode.

Preferably, to align the tuneable mirror to the selected cavity mode, the AC component of the output power is analysed, whereas to align the cavity mode to the etalon peak maximisation of the integrated output power is sought. As described above, the laser output power can be measured by means of a photodetector from a test beam picked off from the output laser beam. In a preferred embodiment, monitoring of the laser output power for aligning both the tuneable mirror to the cavity mode and the cavity mode to the etalon peak, is carried but by means of a photodiode in the configurations shown in FIGS. 3 and 4. Two control algorithms, which operate sequentially, can be implemented to this purpose.

Initial operation points for all channels on the ITU grid are stored in a look-up table. In the look-up table every channel is associated to a voltage $V_{TM}$ applied to the tuneable mirror, and thus to a selectable channel wavelength $\lambda_{TM}$. The look-up table can store also the initial operative values of injection current, $I_{LD}$, which are associated to the channel frequencies.

A loop controller can implement the control algorithms for frequency and mode control. The loop controller for instance includes a driver optical feedback circuit, the driver including a processor with an appropriate program code and look-up table(s).

When laser is turned on or a channel is switched, the driver reads from the look-up table the current $I_{LD}$ to be applied to the laser diode and the voltage $V_{TM}$ to be applied to tuneable mirror. Applicants have observed that parameters corresponding to a given lasing channel may change with respect to those stored in the look-up table(s). If the laser were to drift for some reason, e.g., caused by ageing or by variations of the environment conditions, the stored values may not correspond to the selected channel frequency. This may occur in particular when a laser system is turned on after a relatively long period of inactivity and especially if the laser system is switched on at a temperature significantly different from that at which it was initially calibrated.

Figure 6:
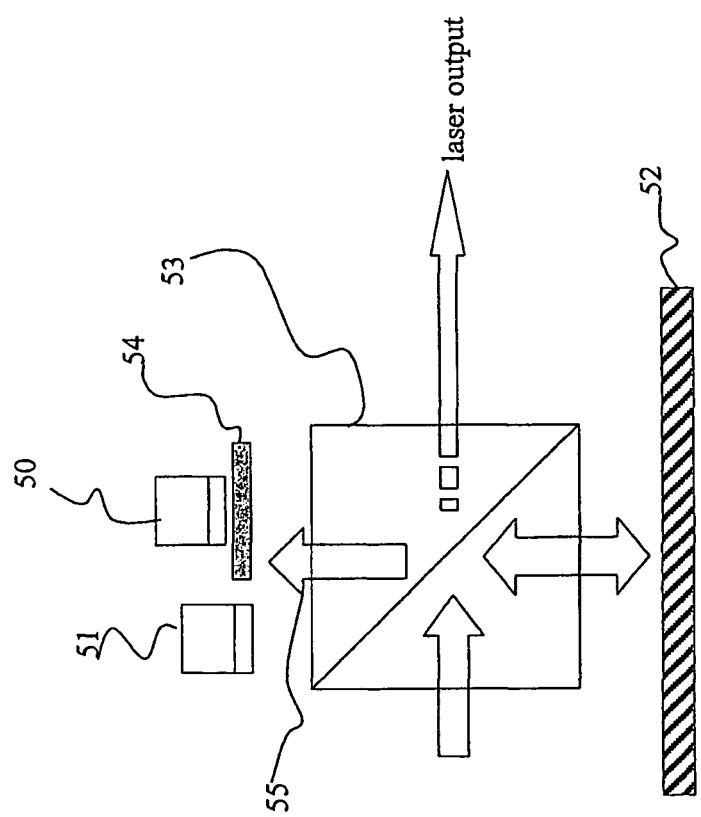
FIG. 6 is a block diagram of part of the laser assembly according to a fourth embodiment of the present invention.

A fourth embodiment of the present invention allows obtaining an absolute reference of the value of the frequency of the lasing channel. FIG. 6 illustrates part of the laser assembly according to the fourth embodiment of the invention. A tuneable mirror 52 and a BS 53 are shown as elements of the laser assembly. As described above, a fraction of the laser light incident on the BS is transmitted in a direction 55 opposite to that propagating towards the tuneable mirror 52. A first photodetector 51 receives the fraction of the light deflected along direction 55 and monitors the optical power. To monitor the wavelength of the laser light, a filter 54 receives the laser light and outputs a filtered light having a transmission that varies with the wavelength. More specifically, filter 54 has a gain attenuation that is a function of the wavelength, e.g., the gain increases linearly with increasing wavelength. The filtered light is received by a second photodetector 50. By monitoring the ratio of the amplitude of the laser light received by the second photodetector to the amplitude of the laser light received by the first photodetector, the lasing wavelength can be determined with a reasonable accuracy. By knowing the lasing frequency, the lasing channel can be derived.

Preferably, first and second photodetectors are photodiodes. To improve compactness of the laser assembly, the first photodiode 51 and the filter 54 can be attached by means of glues to a surface of the beam splitter. The second photodiode 50 can be glued on the back surface of filter 54.

It is to be noted that determining the lasing wavelength by means of the configuration illustrated in FIG. 6 requires that the optical power of the laser light incident on the photodetectors is relatively high in order to have a sufficient accuracy in the wavelength evaluation across the wavelength range of interest, e.g., the C-band. This is due also to the fact that the filtered light has a wavelength-dependent transmission or attenuation, i.e., the gain of the filter can be significantly attenuated in correspondence to certain wavelengths. For example, for laser output beam having a power of the order of 10 dBm, at least about 10% of the incoming light on the beam splitter should be diverted as test beam, which corresponds to a BS having a split ratio of 90%/10% or less. The use of a BS having a splitting ratio of 90%/10% or less is hardly acceptable in case the optical output assembly is arranged as in the embodiment illustrated in FIG. 1 (i.e., the test beam is diverted from the laser output beam by a beam splitter placed in front of the rear facet of the laser diode) because that would significantly penalise the laser output power.

Figure 7:
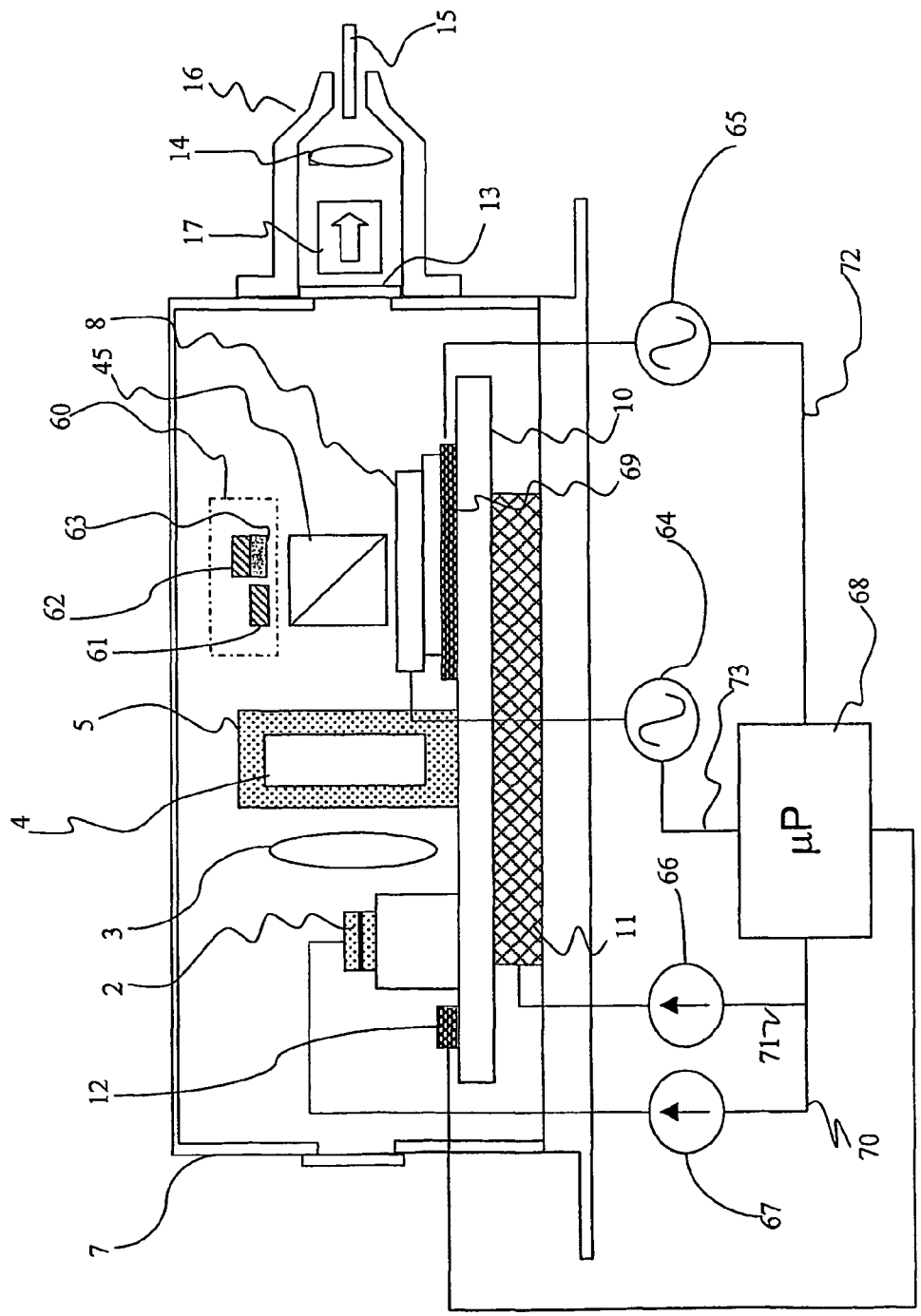
FIG. 7 is a schematic view of the tuneable laser according to a fifth embodiment of the present invention.

FIG. 7 illustrates a tuneable laser system according to a further embodiment of the present invention. The same reference numerals are given to elements of the tuneable laser corresponding to those shown in FIG. 4 and their detailed explanation is omitted. An optical control system 60 includes first photodetector 61, second photodetector 62 and filter 63 having a wavelength-dependent transmission. The configuration of the optical control system 60 is similar to that explained more in detail with reference to FIG. 6. The optical control system 60 is preferably placed on the beam splitter. The laser system of FIG. 7 includes a feedback system allowing closed loop control for ensuring the wavelength alignment and stability of the laser output beam. Thermal control of the thermally conductive platform is achieved by using the thermal sensor device 12, e.g., a thermistor, to provide a temperature feedback signal 69 to microprocessor 68. In response to a temperature variation detected by the thermistor 12 or to an external input, control instructions regarding cooling or heating the platform 10 are given through a temperature control of the TEC 11 provided by feedback signal 71 and a variable current generator 66. The injection current $I_{LD}$ of the laser diode 2 is controlled by a variable current generator 67 through a feedback signal 70. Wavelength tuning is performed by varying the voltage 64 applied to the tuneable mirror 8 and is controlled by the microprocessor by feedback signal 73. A piezoelectric substrate 69 is placed under the tuneable mirror 8 and in thermal contact with the thermally conductive platform 10, e.g., the piezoelectric substrate lays substantially horizontally on the platform. The piezoelectric substrate is thermally conductive, e.g., a piezoelectric ceramic, so as to ensure a good thermal contact between the tuneable mirror and the platform. For example, the piezoelectric ceramic is a single layer ceramic sheet made of lead zirconate titanate ($PbZrTiO_3$) having a few mm of thickness. A variation in the voltage, $V_{PZ}$, applied to the piezoelectric material induces in the material a mechanical deformation, typically of the order of fractions of micron for voltages of a few tens of volts. This causes a variation of the optical path length of the external laser cavity, i.e., the optical lath length can be changed in response to an electrical input to the piezoelectric material. Therefore, within this embodiment, centring of the etalon peak with the cavity mode can be obtained by adjusting $V_{PZ}$ and by monitoring the laser output power. An algorithm that maximises the laser output power can be implemented for tuning of the cavity mode under the peak of the etalon mode. To this purpose, a feedback signal 72 can actuate a variable power supply 65 to the piezoelectric substrate 69 under control of microprocessor 68. A look-up table can store the initial operative values of $V_{PZ}$, which are associated to the channel frequencies. In this way, the adjustments of the injection current, $I_{LD}$, of the laser diode for tuning of the cavity modes are not necessary. However, $I_{LD}$ can be used to control the output power. Whereas adjustments of $V_{PZ}$ can be done to align the cavity modes to the etalon peaks, adjustments of $I_{LD}$ can be carried out concurrently to optimise the output power. Two control algorithms, which operate sequentially, can be implemented to this purpose. Output control by adjusting both $V_{PZ}$ and $I_{LD}$ allows a further degree of freedom for optimisation of the cavity mode centring and of output power. Power uniformity across the channels could be thus obtained.

Figure 8:
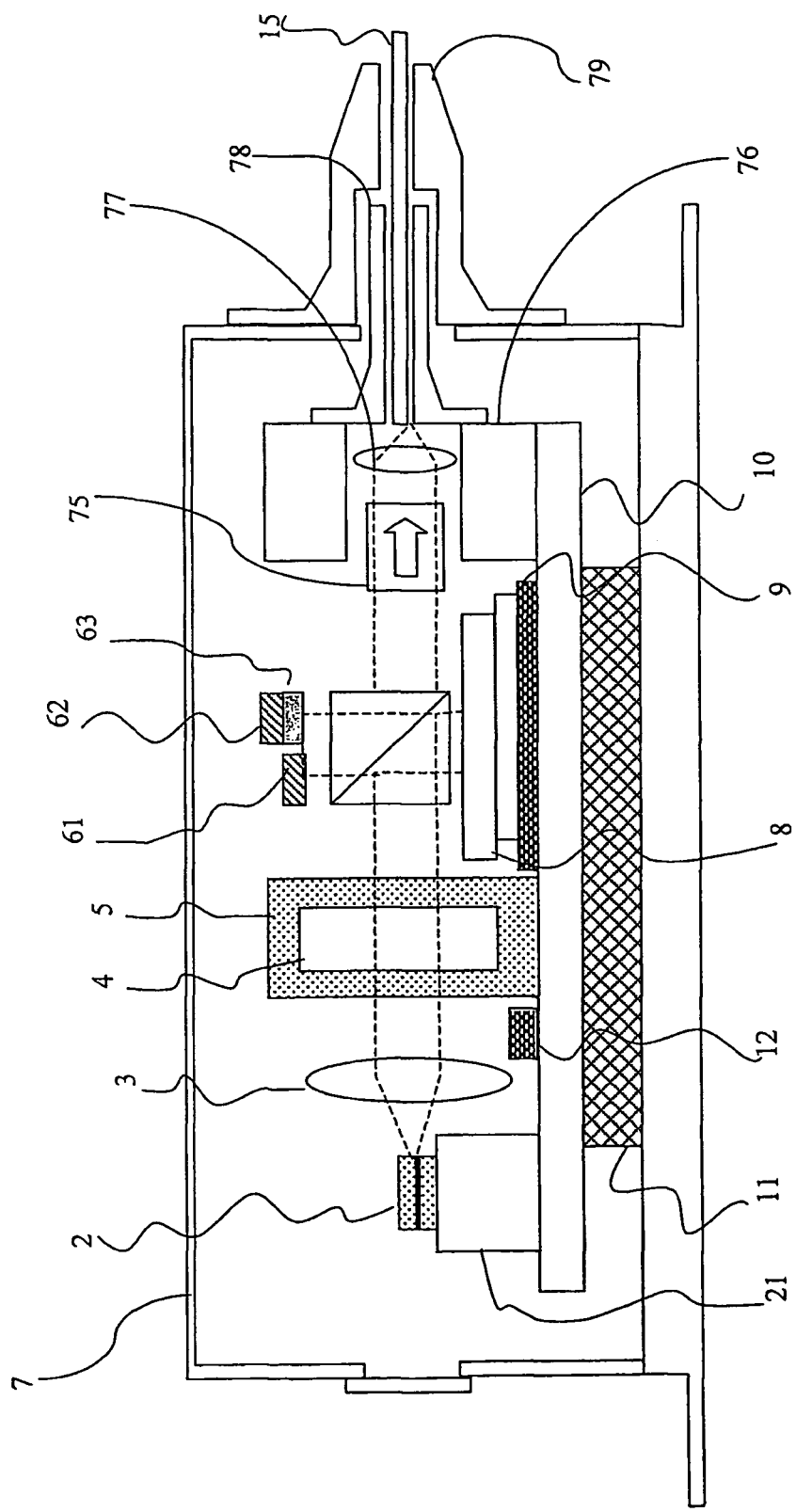
FIG. 8 is a schematic view of the tuneable laser according to a sixth embodiment of the present invention.

Applicants have observed that a mechanical stress on the package (7 in FIG. 7) enclosing the laser assembly can lead to a reduction of optical coupling between the optical fibre 15 and the laser output signal, thereby decreasing the output optical power. In order to improve the mechanical stability of the laser system, the optical output assembly can be mounted on the thermally conductive platform 10, on which the optical elements of the laser cavity are mounted, as illustrated in FIG. 8, according to a preferred embodiment of the invention. An optical isolator 75 and a focussing lens 77 are mounted on a holding structure 76, which is fixed on the thermally conductive platform 10. A ferrule 78, which is fixed to the holding structure 76, holds optical fibre 15. Therefore, according to the present embodiment, the optical elements of the output optics are integral with the wavelength-selective elements (4,8) and the gain medium (2) of the laser cavity so that misalignments between the laser output beam and the output optics for focussing the output beam into the optical fibre are minimised. Furthermore, with this design, thermal stability of the elements of the optical output assembly can be ensured. Preferably, the optical fibre 15 is soldered into the ferrule 78 by means of a hermetic sealant, such as a glass solder. An external boot 79, integral or fixed to the package 7, surrounds the fibre soldered into the ferrule 78 for extra mechanical support and strain relief of the fibre. Preferably, the ferrule 78 is soldered to the external boot 79 by means of a hermetic sealant, so as the fibre ferrule and the external boot form a hermetic optical feed-through.

The invention claimed is:

1. A tuneable laser system configured to emit output radiation, the tuneable laser having an external cavity defining a plurality of cavity modes and comprising:
   a gain medium capable of emitting a laser beam into the external cavity, the gain medium being arranged in a laser package in thermal contact with a thermally conductive platform; a tuneable mirror arranged in the laser package to tuneably select a laser emission frequency, the tuneable mirror having a principal surface arranged substantially parallel to the thermally conductive platform, the principal surface disposed directly on a thermally conductive, electrically insulating substrate in direct thermal conductive contact with the thermally conductive platform;
   a deflector having a reflectivity and a transmittance range of 70-90%, the deflector arranged in the external cavity in the optical path of the laser beam emitted by the gain medium so as to deflect at least a portion of the laser beam toward the tuneable mirror; and
   an optical control system including at least one photodetector, the optical control system being disposed adjacent to the deflector and on an opposite side of the deflector with respect to the tuneable mirror;
   wherein the tuneable mirror is disposed on one side of the deflector to receive the portion of the laser beam deflected by the deflector.

2. The laser system of claim 1, wherein the deflector is arranged so that the light reflected by the deflector toward the tuneable mirror has a direction substantially perpendicular to the direction in which the laser beam emitted by the gain medium travels.

3. The laser system of claim 2, further comprising a supporting structure for holding the deflector, which comprises a U-shaped frame placed on the thermally conductive platform and surrounding the tuneable mirror.

4. The laser system of claim 2, wherein the deflector is provided with reflective layers that are inclined at an angle of 45° to the direction of the laser beam travelling from the gain medium.

5. The laser system of claim 1, further comprising a channel allocation grid element arranged in the external cavity to define a plurality of pass bands substantially aligned with corresponding channels of a selected wavelength grid.

6. The laser system of claim 5, wherein the tuneable mirror is arranged to tuneably select one of the pass bands so as to select a channel to which to tune the optical beam.

7. The laser system of claim 6, wherein the channel allocation grid element is arranged in the optical path of the laser beam emitted by the gain medium between the gain medium and tuneable mirror.

8. The laser system of claim 5, wherein the selected wavelength grid has a channel spacing of 25 to 200 GHz.

9. The laser system of claim 5, wherein the channel allocation grid element is a Fabry-Perot etalon.

10. The laser system of claim 9, wherein the Fabry-Perot etalon is in thermal contact with the thermally conductive platform.

11. The laser system of claim 10, wherein the Fabry-Perot etalon is housed in a thermally conductive housing which is in thermal contact with the thermally conductive platform.

12. The laser system of claim 1, further comprising an optical output assembly, said optical output assembly being placed on the thermally conductive platform.

13. The laser system of claim 1, wherein the gain medium is a semiconductor gain chip.

14. The laser system of claim 1, wherein the thermally conductive platform is in thermal contact with a thermoelectric cooler.

15. The laser system of claim 14, further comprising a thermal device sensor thermally coupled to the platform to provide temperature control of the platform.

16. The laser system of claim 1, wherein the deflector is a beam splitter for splitting the laser beam emitted from the gain medium into a beam portion that is reflected toward the tuneable mirror and a beam portion that is transmitted through the beam splitter.

17. The laser system of claim 16, wherein the beam splitter is arranged in the laser package so that at least part of the transmitted portion of the optical beam is directed along the direction of the optical path of the laser beam emitted by the gain medium.

18. The laser system of claim 16, wherein the transmitted portion of the optical beam gives rise to the laser output light.

19. The laser system of claim 16, further comprising a first photodetector that monitors the beam portion that is transmitted through the beam splitter.

20. The laser system of claim 19, further comprising:
   a filter for receiving the laser light transmitted through the beam splitter and outputs a filtered light having a transmission that varies with the wavelength of the received light; and
   a second photodetector for monitoring the filtered light.

21. The laser system of claim 20, wherein the filter has a gain attenuation that is a function of the wavelength of the laser light.

22. The laser system of claim 16, wherein the beam splitter has a reflectivity of 10% to 30%.

23. The laser system of claim 1, wherein the tuneable mirror is an electro-optical element that comprises a diffraction grating and a planar waveguide optically interacting with said diffraction grating, the diffraction grating and the planar waveguide forming a resonant structure.

24. The laser system of claim 23, wherein the tuneable mirror further comprises a light transmissive material having an index of refraction that varies in response to an electric field applied to the light transmissive material, making the tuneable mirror electrically tuneable, said light transmissive material forming a tuneable cladding layer for the planar waveguide.

25. The laser system of claim 24, wherein the light transmissive material comprises a liquid crystal material.

26. The laser system of claim 1, wherein the tuneable mirror is placed on a holder made of a thermally conductive material, the holder being placed on the thermally conductive platform.

27. The laser system of claim 26, wherein the holder comprises a piezoelectric substrate.

28. The laser system of claim 27, further comprising a variable power supply electrically connected to the piezoelectric substrate capable of applying a voltage to the substrate in order to induce a mechanical deformation in the substrate.

29. The laser system of claim 1, wherein the laser system is configured to emit output radiation at a laser emission frequency on a single longitudinal mode.

30. The laser system of claim 1, wherein said tuneable mirror lays substantially horizontally on the thermally conductive platform.

* * * * *